United States Patent
Choi et al.

(10) Patent No.: US 8,480,931 B2
(45) Date of Patent: Jul. 9, 2013

(54) COMPOSITE STRUCTURE AND METHOD OF MANUFACTURING THE SAME

(75) Inventors: Byoung-lyong Choi, Yongin-si (KR); Eun-kyung Lee, Yongin-si (KR); Dong-mok Whang, Suwon-si (KR); Byung-sung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 386 days.

(21) Appl. No.: 12/766,258

(22) Filed: Apr. 23, 2010

(65) Prior Publication Data

US 2011/0114894 A1    May 19, 2011

(30) Foreign Application Priority Data

Nov. 17, 2009  (KR) .......................... 10-2009-0110922

(51) Int. Cl.
*H01B 1/04* (2006.01)
(52) U.S. Cl.
USPC ........ 252/502; 252/500; 252/506; 252/518.1; 252/519.4; 977/734; 977/755; 977/762; 977/773; 977/777; 977/810
(58) Field of Classification Search
USPC ............ 252/500–518, 518.1, 519.4; 427/402; 977/734, 755, 762, 773.777, 810
See application file for complete search history.

(56) References Cited

U.S. PATENT DOCUMENTS

| | | | |
|---|---|---|---|
| 7,449,133 B2 | 11/2008 | Gruner et al. | |
| 2006/0051401 A1* | 3/2006 | Manohar et al. | 424/443 |
| 2007/0212538 A1* | 9/2007 | Niu | 428/367 |
| 2008/0259262 A1 | 10/2008 | Jones et al. | |
| 2009/0176159 A1* | 7/2009 | Zhamu et al. | 429/222 |
| 2011/0253205 A1* | 10/2011 | Grossman et al. | 136/255 |

FOREIGN PATENT DOCUMENTS

| | | |
|---|---|---|
| KR | 10-893437 B1 | 4/2009 |
| WO | 2008124167 A1 | 10/2008 |

OTHER PUBLICATIONS

Dimitrakakis et al. ("Pillared Graphene: A New 3-D Network Nanostructure for Enhanced Hydrogen Storage" NanoLetters, 8(10), pp. 3166-3170, Sep. 19 2008).*

Kondo et al. ("Self-organization of Novel Carbon Composite Structure: Graphene Multi-Layers Combined Perpendicularly with Aligned Carbon Nanotubes." App. Phys. Exp, 1 (074003), pp. 1-3, pub online Jun. 20 2008).*

Yi et al. ("ZnO nanorods: synthesis, characterization and applications." Semicond. Sci. and Tech, 20, pp. s22-s34, pub Mar. 15, 2005).*

Artyukh et al. ("Mechanical and electronic properties of carbon nanotube-graphene compounds." Phys Status Solidi B, 247(10-11), pp. 2927-2930, online Sep. 13, 2010).*

Jung Min Lee, et al., "ZnO Nanorod-Graphene Hybrid Architectures for Multifunctional Conductors", J. Phys. Chem. C. 2009, 113: 19134-19138.

Wei Tao Zheng, et al., "Field Emission from a Composite of Graphene Sheets and ZnO Nanowires", J. Phys. Chem. C., 2009, 113: 9164-9168.

European Search Report for Application No. 10166851.5 dated Mar. 14, 2011.

* cited by examiner

*Primary Examiner* — Tri V Nguyen (74) *Attorney, Agent, or Firm* — Cantor Colburn LLP (57) ABSTRACT

A composite structure and a method of manufacturing the composite structure. The composite structure includes a graphene sheet; and a nanostructure oriented through the graphene sheet and having a substantially one-dimensional shape.

5 Claims, 9 Drawing Sheets

COMPOSITE STRUCTURE AND METHOD OF MANUFACTURING THE SAME

CROSS-REFERENCE TO RELATED APPLICATIONS

This application claims priority to Korean Patent Application No. 10-2009-0110922, filed on Nov. 17, 2009, and all the benefits accruing therefrom under 35 U.S.C. §119, the content of which in its entirety is herein incorporated by reference.

BACKGROUND

1. Field

The present disclosure relates to a composite structure, and more particularly, to a composite structure including a graphene sheet having a substantially two-dimensional shape and a nanostructure having a substantially one-dimensional shape, and a method of manufacturing the composite structure.

2. Description of the Related Art

Although carbon nanotubes have been known since at least the 1990s, graphene having a plate-shape structure has been only recently available. Graphene is a thin-film material having a thickness of several nanometers. In graphene, carbon atoms are arrayed in two-dimensions and graphene has high electrical conductivity because a charge therein functions as particle having zero effective mass. Graphene also has high thermal conductivity and high elasticity. Thus, graphene and various applications thereof have been intensively studied. Accordingly, it has been determined that graphene can be used to manufacture transparent and flexible devices due to its high electrical conductivity and elastic characteristics.

SUMMARY

Provided is a composite structure including a graphene sheet having a substantially two-dimensional shape and a nanostructure having a substantially one-dimensional shape, and a method of manufacturing the composite structure.

Additional aspects will be set forth in part in the description which follows and, in part, will be apparent from the description.

According to an aspect, a composite structure includes a graphene sheet and a nanostructure oriented through the graphene sheet and having a substantially one-dimensional shape.

The nanostructure may be a nanowire, a nanotube, or a nanorod.

The nanostructure may be oriented through the graphene sheet such that the nanostructure and the graphene sheet have a common cross-section. Alternatively, the nanostructure may be oriented through the graphene sheet such that the nanostructure and the graphene do not have a common cross-section.

A plurality of graphene sheets may be disposed at a regular interval, and the nanostructure may be oriented through the plurality of graphene sheets.

The nanostructure may include a group IV semiconductor, a group III-V semiconductor, a group II-VI semiconductor, a group IV-IV semiconductor, a group IV-V-VI semiconductor, an oxide semiconductor, a nitride semiconductor, a metal, or a combination including at least one of the foregoing.

The nanostructure may further include a heterostructure in a radial direction or a heterostructure in a longitudinal direction. The nanostructure may be doped with material that alters the electrical properties of the nanostructure.

According to another aspect, a method of manufacturing a composite structure includes preparing a substrate; disposing a graphene sheet on the substrate; forming a nanostructure having a substantially one-dimensional shape on the substrate, growing the nanostructure; and penetrating the graphene sheet with the nanostructure to form the composite structure.

The method may further include surface treating the substrate after preparing the substrate.

The graphene sheet that is disposed nearest the substrate may contact or may not contact the substrate. The graphene sheets of the plurality of graphene sheets may be separated from each other by a regular interval. The plurality of the graphene sheets may contact each other.

The method may further include disposing a metal catalyst layer on the substrate after preparing the substrate. In an embodiment, the nanostructure may be grown from the metal catalyst layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In the drawings, the thicknesses of layers and regions are exaggerated for clarity. This invention may be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
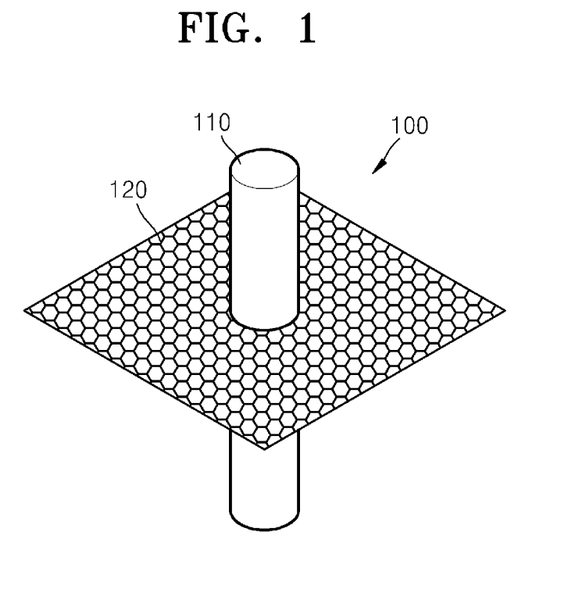
FIG. 1 is a perspective view of an exemplary embodiment of a composite structure including a graphene sheet and a nanostructure.
Figure 2:
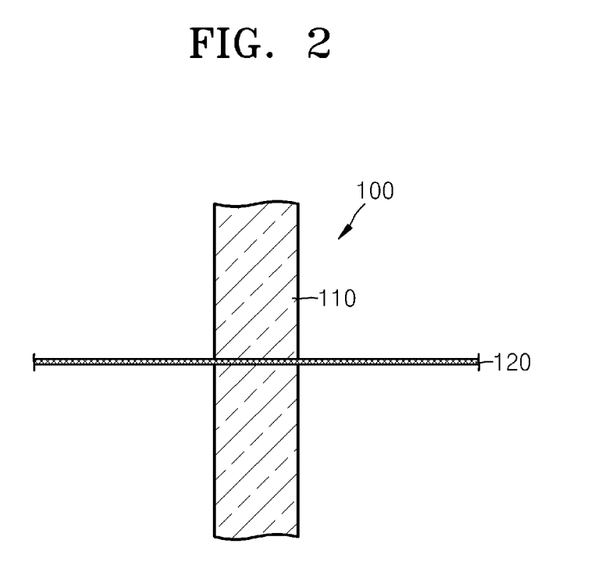
FIG. 2 is a cross-sectional view of the composite structure illustrated in FIG. 1.

FIG. 1 is a perspective view of a composite structure 100 including a graphene sheet 120 and a nanostructure 110. FIG. 2 is a cross-sectional view of the composite structure 100 illustrated in FIG. 1.

Referring to FIGS. 1 and 2, the composite structure 100 includes the graphene sheet 120 and the nanostructure 110 that is oriented (e.g., grown) through the graphene sheet 120. The graphene sheet 120 is a thin-film material having a plate-shaped structure, having a thickness of several nanometers, and a structure in which carbon atoms are arrayed in two-dimensions. The graphene sheet 120 has high electrical conductivity because a charge therein functions as a particle having zero effective mass, and the graphene sheet also has high elasticity, high thermal conductivity, and the like. The nanostructure 110 is oriented (e.g., grown) through the graphene sheet 120, and has a substantially one-dimensional shape. As illustrated in the various figures, the cross-sectional shape of the one-dimensional nanostructure 110 may be cylindrical, but other cross-sectional shapes are possible, for example, hexagonal, elliptical, and the like. The cross-section can vary in size along the length of the nanostructure 110, but in one embodiment, the size is substantially the same along the length of the nanostructure 110. For example, the nanostructure 110 may be a nanowire, but is not limited thereto. Thus, the nanostructure 110 may be a nanotube such as a carbon nanotube ("CNT"), or a nanorod. Further as illustrated in the various figures, the nanostructure 110 may extend in a direction substantially perpendicular to the graphene sheet, but is not limited to this orientation Thus, the nanostructure 110 may be oriented (e.g., grown) in an orientation that is substantially vertical or inclined relative to the graphene sheet 120.

Figure 3:
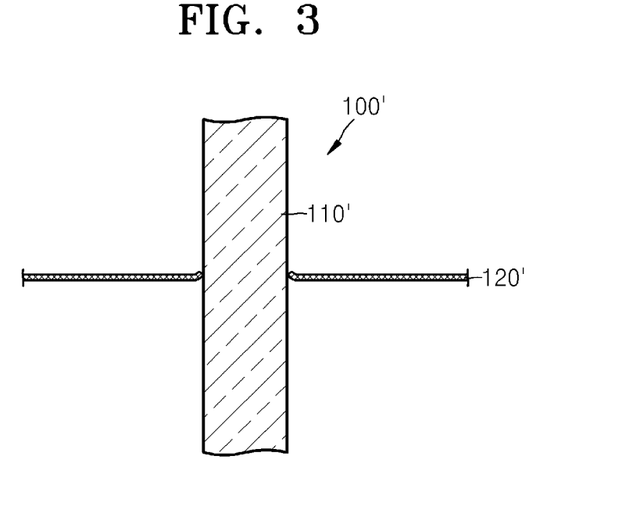
FIG. 3 is a cross-sectional view of another exemplary embodiment of a composite structure.

As illustrated in FIG. 2, the nanostructure 110 may be oriented (e.g., grown) through the graphene sheet 120 such that the nanostructure 110 and the graphene sheet 120 have a common cross-section. In another embodiment, as illustrated in FIG. 3, a nanostructure 110' may be oriented (e.g., grown) such that the nanostructure 110' and the graphene sheet 120' do not have a common cross-section. Referring to FIG. 3, a composite structure 100' may include the graphene sheet 120' and the nanostructure 110' having a substantially one-dimensional, cylindrical, or tubular shape wherein the nanostructure 110' is oriented (e.g., grown) through the graphene sheet 120, without containing the graphene sheet 120' therein.

The nanostructure 110 may comprise various materials. For example, the nanostructure 110 may comprise a group IV semiconductor including C, Si, or Ge, a group III-V semiconductor, a group II-VI semiconductor, a group IV-IV semiconductor, a group IV-V-VI semiconductor, or a combination comprising at least one of the foregoing, wherein "group" refers to a group of the periodic table of the elements. In addition, the nanostructure 110 may comprise an oxide semiconductor including ZnO, a nitride semiconductor, a metal, or a combination comprising at least one of the foregoing, but is not limited thereto. Thus, the nanostructure 110 may comprise various materials. In another embodiment, the nanostructure 110 may have a heterostructure in which different component materials are combined with each other, thus the nanostructure may include e.g., a heterostructure in a radial direction or a heterostructure in a longitudinal direction, or a combination comprising at least one of the foregoing.

Figure 4:
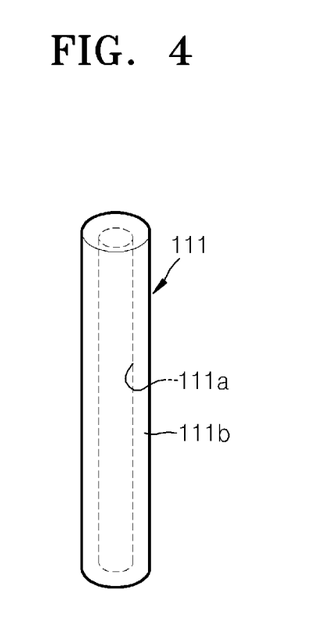
FIG. 4 is a diagram of an exemplary embodiment of a nanostructure.

FIG. 4 is a diagram of an exemplary embodiment of a nanostructure 111 having a heterostructure in a radial direction. Referring to FIG. 4, the nanostructure 111 includes a core 111a and a shell 111b surrounding the core 111a. The core 111a and the shell 111b may each independently comprise a group IV semiconductor, a group III-V semiconductor, a group II-VI semiconductor, a group IV-IV semiconductor, a group IV-V-VI semiconductor, an oxide semiconductor, a nitride semiconductor, a metal, or a combination comprising at least one of the foregoing, but is not limited thereto. Thus, the core 111a and the shell 111b may comprise various materials, other than or in addition to the aforementioned materials. For example, the core 111a and the shell 111b may each independently be doped with a material that alters the electrical properties of the core or the shell, for example a conductive material, or a donor or an acceptor, including a p-type material or an n-type material.

Figure 5:
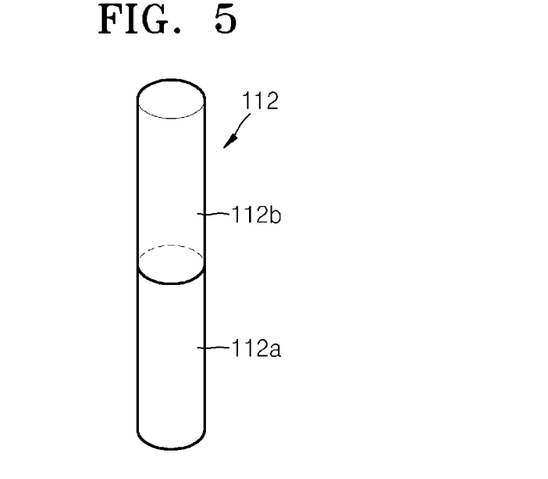
FIG. 5 is a diagram of another exemplary embodiment of a nanostructure.

FIG. 5 is a diagram of a nanostructure 112 having a heterostructure in a longitudinal direction. Referring to FIG. 5, the nanostructure 112 includes first and second nanostructures 112a and 112b, respectively, each of which has a substantially linear shape. The first and second nanostructures 112a and 112b may comprise a group IV semiconductor, a group III-V semiconductor, a group II-VI semiconductor, a group IV-IV semiconductor, a group IV-V-VI semiconductor, an oxide semiconductor, a nitride semiconductor, a metal, or a combination comprising at least one of the foregoing. Also, the first and second nanostructures 112a and 112b may each be independently doped with a material that alters the electrical properties of the nanostructure, for example a conductive material, or a donor or an acceptor, including a p-type material or an n-type material.

Because the nanostructure 110 having a substantially one-dimensional shape is oriented (e.g., grown) through the graphene sheet 120, which has a substantially two-dimensional (e.g., sheet-like) shape, the composite structure 100 has a three-dimensional shape. In the composite structure 100, an electrical charge that is delivered via the graphene sheet 120, which has high electrical conductivity, may move along the nanostructure 110, which has a substantially one-dimensional shape, or a charge that is delivered via the nanostructure 110 may rapidly move through the graphene sheet 120. The composite structure 100, which includes the graphene sheet 120 and the nanostructure 110, may be applied to a logic device, a memory device, a supercapacitor, a sensor, an optical device, an energy device, a transparent display device, or the like. The composite structure 100, which may be manufactured by combining the graphene sheet 120, which is flexible and has high strength, with the nanostructure 110, which may be a nanowire, may be usefully applied to embody a flexible and stretchable device. In another embodiment, the composite structure 100 may have an array shape and include a plurality of graphene sheets and a plurality of nanostructures.

Figure 6:
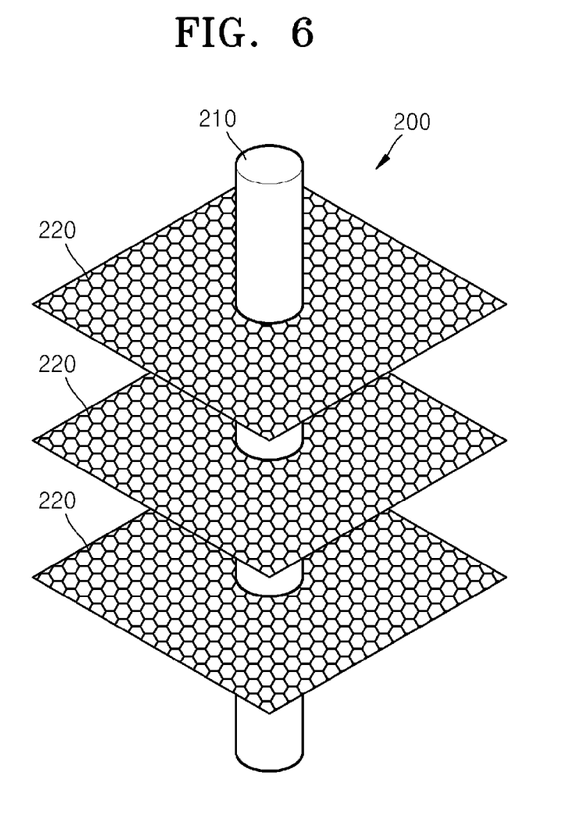
FIG. 6 is a perspective view of an exemplary embodiment of a composite structure including a plurality of graphene sheets and a nanostructure.

FIG. 6 is a perspective view of a composite structure 200 including a plurality of graphene sheets 220 and a nanostructure 210 according to another embodiment.

Referring to FIG. 6, the composite structure 200 includes the plurality of graphene sheets 220 and the nanostructure 210 that is oriented (e.g., grown) through the plurality of graphene sheets 220. An interval between each graphene sheet of the plurality of graphene sheets 220 may be appropriately selected according to a design condition. Also, in FIG. 6 three graphene sheets 220 are shown, however the disclosed embodiments are not limited thereto. Thus, the number of graphene sheets may vary. The nanostructure 210 has a substantially one-dimensional shape, and may be a nanowire, a nanotube, or a nanorod. The nanostructure 210 may comprise a group IV semiconductor, a group III-V semi-conductor, a group II-VI semiconductor, a group IV-IV semiconductor, a group IV-V-VI semiconductor, an oxide semiconductor, a nitride semiconductor, a metal, or a combination comprising at least one of the foregoing. The nanostructure 210 may be oriented (e.g., grown) through the plurality of graphene sheets 220 such that the nanostructure 210 and each graphene sheet of the plurality of graphene sheets 220 have or do not have a common cross-section. In another embodiment, the nanostructure 210 may be oriented (e.g., grown) through the plurality of graphene sheets 220 such that a portion of the nanostructure 210 and the plurality of graphene sheets 220 have a common cross-section and another portion of the nanostructure 210 and the plurality of graphene sheets 220 do not have a common cross-section. In addition, the nanostructure 210 may be composed of a single material or may comprise a heterostructure in which different materials are combined with each other. For example, the nanostructure 210 may have a heterostructure in a radial direction or a longitudinal direction. In an embodiment, the nanostructure 210 may be doped with a material that alters the electrical properties of the nanostructure, for example a conductive material, or a donor or an acceptor, including a p-type material or an n-type material.

Figure 7:
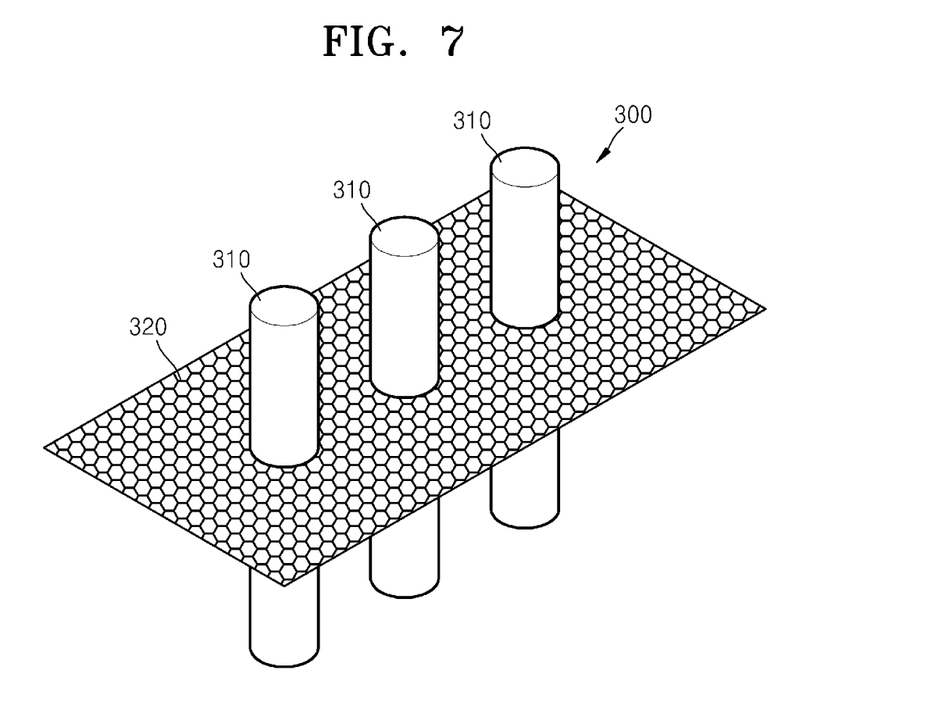
FIG. 7 is a perspective view of an exemplary embodiment of a composite structure including a graphene sheet and a plurality of nanostructures.

FIG. 7 is a perspective view of a composite structure 300 including a graphene sheet 320 and a plurality of nanostructures 310 according to another embodiment.

Referring to FIG. 7, the composite structure 300 includes the graphene sheet 320 and the plurality of nanostructures 310 that is oriented (e.g., grown) through the graphene sheet 320. An interval between each nanostructure of the plurality of nanostructures 310 may be appropriately selected according to a design condition. In addition, in FIG. 7 three nanostructures 310 are shown, however the disclosed embodiments are not limited thereto. Thus, the number of nanostructures of the plurality of nanostructures 310 may vary. Each nanostructure of the plurality of nanostructures 310 may have a substantially one-dimensional shape and may be a nanowire, a nanotube, or a nanorod. In addition, each nanostructure of the plurality of nanostructures 310 may be oriented (e.g., grown) such that at least one of the nanostructures of the plurality of nanostructures 310 and the graphene sheet 320 have or do not have a common cross-section. Thus in one embodiment, each nanostructure of the plurality of nanostructures 310 and the graphene sheet 320 have a common cross-section, in another embodiment none of the nanostructures 310 and the graphene sheet 320 have a common cross-section, and in another embodiment at least one nanostructure of the plurality of nanostructures 310 has a common cross-section with the graphene sheet 320 and at least one nanostructure of the plurality of nanostructures 310 and the graphene sheet 320 do not have a common cross-section. In addition, each nanostructure of the plurality of nanostructures 310 may independently be composed of a single material or may have a heterostructure in which different materials are combined with each other. For example, each nanostructure of the plurality of nanostructures 310 may have a heterostructure in a radial direction or a longitudinal direction. Also, the plurality of nanostructures 310 may be composed of the same material or each nanostructure of the plurality of nanostructures 310 may independently be composed of a different material.

Figure 8:
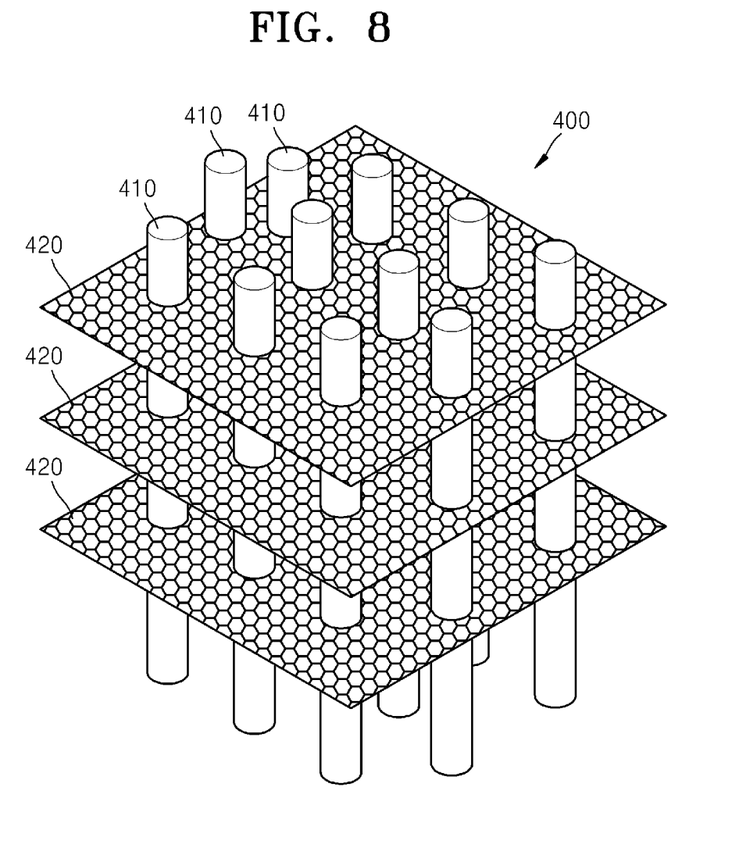
FIG. 8 is a perspective view of an exemplary embodiment of a composite structure including a plurality of graphene sheets and a plurality of nanostructures.

FIG. 8 is a perspective view of a composite structure 400 including a plurality of graphene sheets 420 and a plurality of nanostructures 410 according to another embodiment.

Referring to FIG. 8, the composite structure 400 includes the plurality of graphene sheets 420 and the plurality of nanostructures 410 that are oriented (e.g., grown) through the plurality of graphene sheets 420. An interval between each graphene sheet of the plurality of graphene sheets 420 and each nanostructure of the plurality of nanostructures 410 may be appropriately selected according to a design condition. The number of the graphene sheets 420 and the number of the nanostructures 410 may vary. Each nanostructure of the plurality of nanostructures 410 may have a substantially one-dimensional shape, and may independently be a nanowire, a nanotube, or a nanorod. In addition, each nanostructure of the plurality of nanostructures 410 may be oriented (e.g., grown) through the plurality of graphene sheets 420 such that each nanostructure of the plurality of nanostructures 410 and each graphene sheet of the plurality of graphene sheets 420 may independently have or not have a common cross-section. Thus in one embodiment, each nanostructure of the plurality of nanostructures 410 and each graphene sheet of the plurality of graphene sheets 420 has a common cross-section, in another embodiment none of the plurality of nanostructures 410 and the plurality of graphene sheets 420 have a common cross-section, and in another embodiment at least one nanostructure of the plurality of nanostructures 410 has a common cross-section with at least one graphene sheet of the plurality of graphene sheets 420 and at least one nanostructure of the plurality of nanostructures 410 and at least one graphene sheet of the plurality of graphene sheets 420 do not have a common cross-section.

Hereinafter, a method of manufacturing a composite structure of a graphene sheet and a nanostructure will be further disclosed.

FIGS. 9 through 13 are diagrams describing an exemplary embodiment of a method of manufacturing a composite structure including a graphene sheet and a nanostructure.

Figure 9:
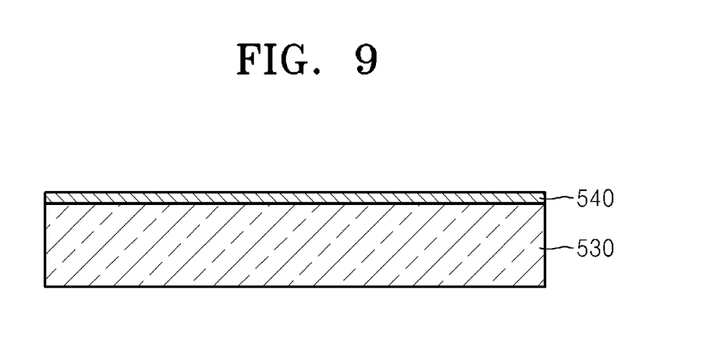
FIGS. 9 through 13 are diagrams describing an exemplary embodiment of a method of manufacturing a composite structure including a graphene and a nanostructure.

Referring to FIG. 9, a substrate 530 is prepared. The substrate 530 may be a silicon substrate or a glass substrate, and thus may comprise silicon, a glass, or a combination comprising at least one of the foregoing. However, the substrate 530 is not limited thereto, and thus various types of materials may be used as the substrate 530. Then, a metal catalyst layer 540 is disposed (e.g., formed) on a top surface of the substrate 530. The metal catalyst layer 540 functions as a seed layer to grow a plurality of nanostructures 510, each of which may have a substantially one-dimensional shape as further disclosed below. A material for forming the metal catalyst layer 540 may be selected according to a material for growing the nanostructures 510. After disposing (e.g., forming) the metal catalyst layer 540, the metal catalyst layer 540 may be patterned. Accordingly, when the metal catalyst layer 540 is patterned, it is possible to select a density and a size of the nanostructures 510 to be grown.

Figure 10:
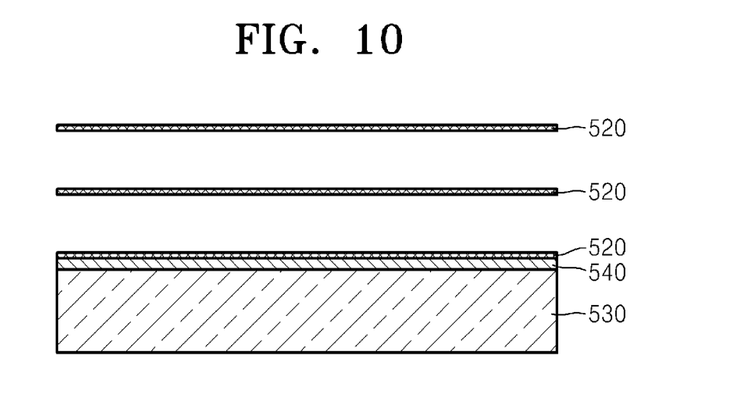

Referring to FIG. 10, a plurality of graphene sheets 520 are disposed at a regular interval above the metal catalyst layer 540, which is disposed on the substrate 530. The graphene sheet of the plurality of graphene sheets 520 disposed at the lowest position may contact the metal catalyst layer 540. The remaining graphene sheets of the plurality of graphene sheets 520 that are disposed to be separated from the substrate 530 may be supported by a spacer (not shown). Although in FIG. 10 three graphene sheets 520 that are disposed on the substrate 530 are shown, the present invention is not limited thereto. Thus, the number of the graphene sheets 520 on the substrate 530 may vary, and in further detail, at least one graphene sheet of the plurality of graphene sheets 520 may be disposed on the substrate 530.

Figure 11:
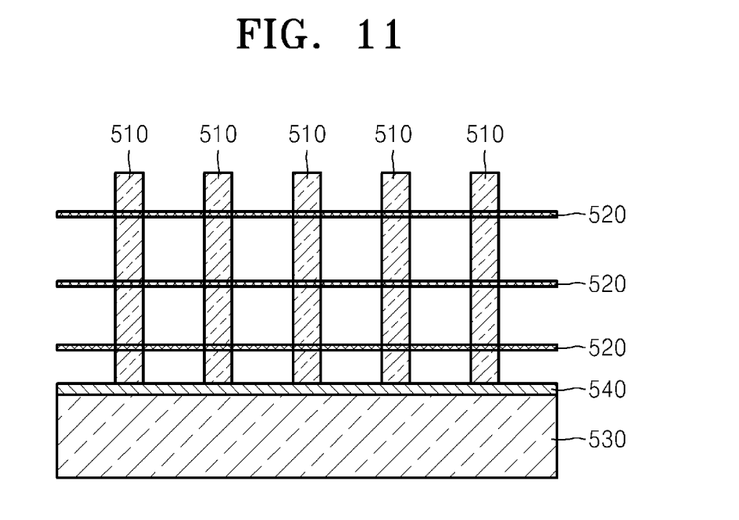

Referring to FIG. 11, the plurality of nanostructures 510, each having a substantially one-dimensional shape, are grown from the metal catalyst layer 540. Each of the nanostructures 510 may independently be a nanowire, a nanotube, or a nanorod. The plurality of nanostructures 510 may be grown via a dry process, such as chemical vapor deposition ("CVD"), or a wet process, such as a process in which the plurality of nanostructures 510 are grown in a solution. The plurality of nanostructures 510 may each independently comprise a group IV semiconductor including C, Si, or Ge, a group III-V semiconductor, a group II-VI semiconductor, a group IV-IV semiconductor, a group IV-V-VI semiconductor, or a combination comprising at least one of the foregoing. In addition, the plurality of nanostructures 510 may each independently comprise an oxide semiconductor including ZnO, a nitride semiconductor, a metal, or a combination comprising at least one of the foregoing, but the nanostructure is not limited thereto. Thus, the plurality of nanostructures 510 may comprise various materials. In another embodiment, all of the nanostructures of the plurality of nanostructures 510 are composed of the same material.

The plurality of nanostructures 510 are oriented (e.g., grown) through the plurality of graphene sheets 520 via the aforementioned growing process. Each nanostructure of the plurality of nanostructures 510 may be oriented (e.g., grown) through the plurality of graphene sheets 520 such that each nanostructure of the plurality of nanostructures 510 and each graphene sheet of the plurality of graphene sheets 520 have a common cross-section. Alternatively, each nanostructure of the plurality of nanostructures 510 may be oriented (e.g., grown) through the plurality of graphene sheets 520 such that none of the nanostructures and the graphene sheets have a common cross-section. In another embodiment, at least one of the nanostructures of the plurality of nanostructures 510 is oriented (e.g., grown) through the plurality of graphene sheets 520 such that at least one of the nanostructures and at least one of the graphene sheets do not have a common cross-section and at least one of the nanostructures is oriented (e.g., grown) through the graphene sheets such that at least one nanostructure and at least one graphene sheet have a common cross-section. When the plurality of nanostructures 510 are oriented (e.g., grown) through the plurality of graphene sheets 520, each graphene sheet of the plurality of graphene sheets 520 may be moved by a regular distance in a growth direction of the nanostructures 510 relative to an adjacent graphene sheet.

The plurality of nanostructures 510 may each independently be composed of a single material or may each independently have a heterostructure in which different materials are combined with each other. For example, the plurality of nanostructures 510 may have a heterostructure in a radial direction or a heterostructure in a longitudinal direction. As further described above, each nanostructure of the plurality of nanostructures 510 having the heterostructure may independently comprise a group IV semiconductor, a group III-V semiconductor, a group II-VI semiconductor, a group IV-IV semiconductor, a group IV-V-VI semiconductor, an oxide semiconductor, a nitride semiconductor, a metal, or a combination comprising at least one of the foregoing. In an embodiment, each of the plurality of nanostructures 510 may independently be doped with a material that alters the electrical properties of the nanostructure, for example a conductive material, or a donor or an acceptor, including a p-type material or an n-type material.

Figure 12:
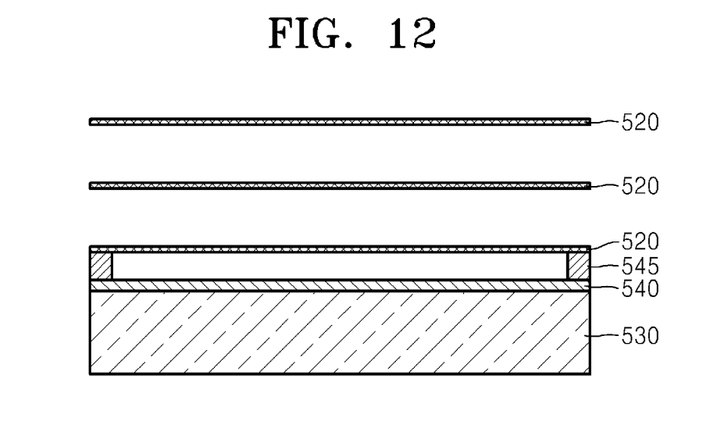
Figure 13:
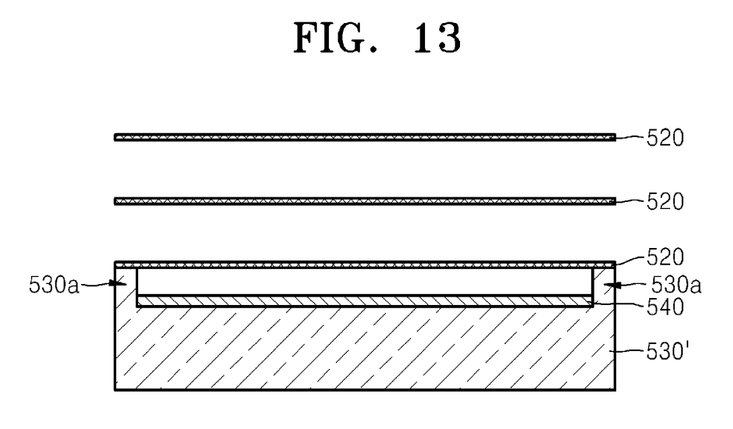

In addition, as illustrated in FIG. 10, the graphene sheet of the plurality of graphene sheets 520 nearest the substrate (at the lowest position in FIG. 10) may contact the metal catalyst layer 540. In another embodiment, as illustrated in FIG. 12, the graphene sheet nearest the substrate (the lowest positioned graphene sheet of the plurality of graphene sheets 520 in FIG. 12) may be separated from the metal catalyst layer 540 by a spacer 545 that is disposed on the metal catalyst layer 540 and has a selected height. By growing the plurality of nanostructures 510, each of which independently may be a nanowire, a nanorod, or a nanotube, from the metal catalyst layer 540, as illustrated in FIG. 11, each nanostructure of the plurality of nanostructures 510 may have a substantially one-dimensional shape and may be oriented (e.g., grown) through the plurality of graphene sheets 520. In addition, as illustrated in FIG. 13, the graphene sheet nearest the substrate (the lowest positioned graphene sheet in FIG. 13) may be separated from the metal catalyst layer 540 by a protrusion 530a that is disposed on an end of a substrate 530'. The protrusion 530a may be formed on the substrate 530' via an etching process, and the metal catalyst layer 540 may be disposed (e.g., formed) on a top surface of the substrate 530' between a plurality of the protrusions.

Figure 14:
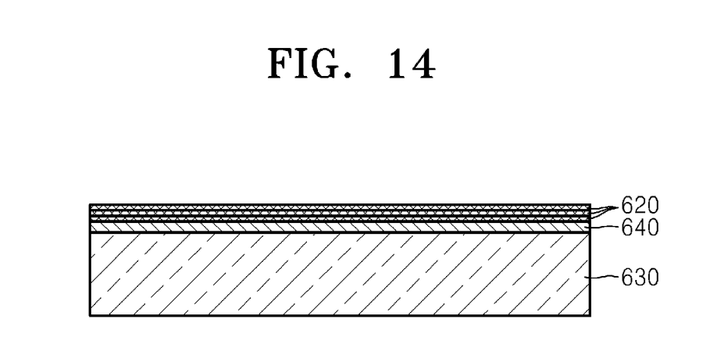
FIGS. 14 and 15 are diagrams of an exemplary embodiment of a method of manufacturing a composite structure including a plurality of graphene sheets and a plurality of nanostructures.
Figure 15:
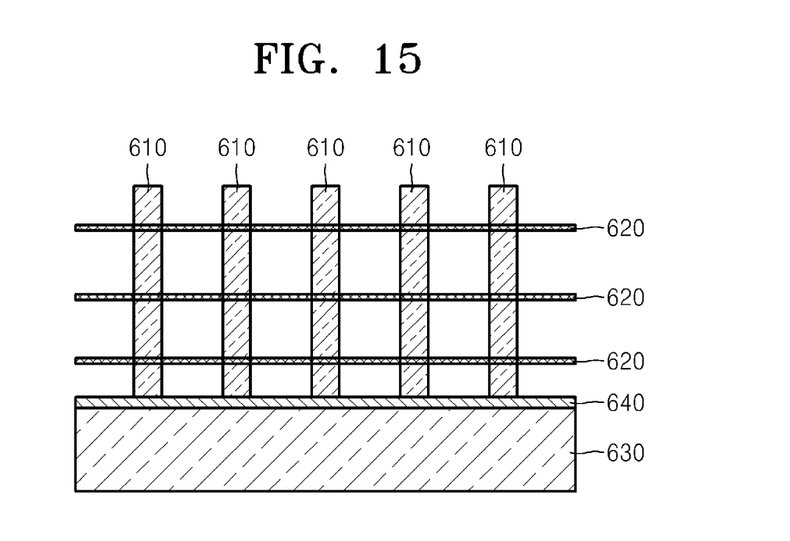

FIGS. 14 and 15 are diagrams describing another exemplary embodiment of a method of manufacturing a composite structure including a plurality of graphene sheets 620 and a plurality of nanostructures 610. Hereinafter, the method of FIGS. 14 and 15 will be described with respect to differences from the previously disclosed methods.

Referring to FIG. 14, a substrate 630 is prepared, and then a metal catalyst layer 640 is disposed (e.g., formed) on a top surface of the substrate 630. In an embodiment, after forming the metal catalyst layer 640, the metal catalyst layer 640 may be patterned. After that, the plurality of graphene sheets 620 are disposed to contact each other on the metal catalyst layer 640.

Referring to FIG. 15, the plurality of nanostructures 610, each of which has a substantially one-dimensional shape, are grown from the metal catalyst layer 640. Each nanostructure of the plurality of nanostructures 610 may be a nanowire, a nanotube, or a nanorod. The plurality of nanostructures 610 may be grown via a dry process or a wet process. For example, each nanostructure of the plurality of nanostructures 610 may independently comprise a group IV semiconductor, a group III-V semiconductor, a group II-VI semiconductor, a group IV-IV semiconductor, a group IV-V-VI semiconductor, an oxide semiconductor, a nitride semiconductor, a metal, or a combination comprising at least one of the foregoing.

The plurality of nanostructures 610 may be grown through the plurality of graphene sheets 620 via the aforementioned growing process. When the plurality of nanostructures 610 are grown through the plurality of graphene sheets 620, each graphene sheet of the plurality of graphene sheets 620 may be moved by a regular distance in a growth direction of the nanostructures 610 relative to an adjacent graphene sheet. Accordingly, the graphene sheets of the plurality of graphene sheets 620 that are penetrated by the nanostructures 610 may be separated from each other by a regular interval and be disposed above the substrate 630. Each nanostructure of the plurality of nanostructures 610 may be grown through the plurality of graphene sheets 620 such that each nanostructure of the plurality of nanostructures 610 and each graphene sheet of the plurality of graphene sheets 620 has a common cross-section. Alternatively, each nanostructure of the plurality of nanostructures 610 may be grown through the plurality of graphene sheets 620 such that none of the plurality of nanostructures 610 and the plurality graphene sheets 620 have a common cross-section. In another embodiment, the plurality of nanostructures 610 may be oriented (e.g., grown) through the plurality of graphene sheets 620 such that a portion of the plurality of nanostructures 610 and the plurality of graphene sheets 620 have a common cross-section and another portion of the plurality of nanostructures 610 and the plurality of graphene sheets 620 do not have a common cross-section.

Each nanostructure of the plurality of nanostructures 610 may independently be composed of a single material or may have a heterostructure in which different materials are combined with each other. In an embodiment each of the nanostructures may be composed of the same material, and in another embodiment each of the nanostructures may be composed of a different material. In an embodiment, each nanostructure of the plurality of nanostructures 610 may independently be doped with a material that alters the electrical properties of the nanostructure, for example a conductive material, or a donor or an acceptor, including a p-type material or an n-type material.

FIGS. 16 through 20 are diagrams describing another exemplary embodiment of a method of manufacturing a composite structure including a plurality of graphene sheets 720 and a plurality of nanostructures 710. Hereinafter, the method of FIGS. 16 through 20 will be described with respect to differences from previously disclosed methods.

Figure 16:
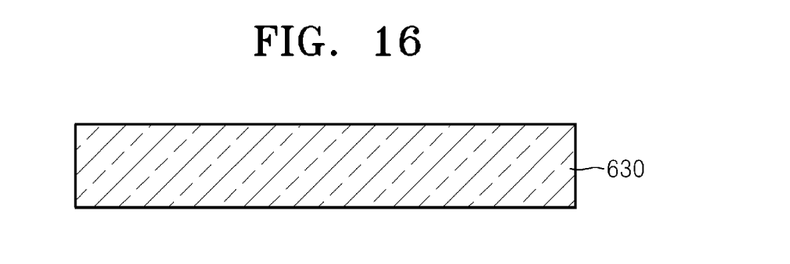
FIGS. 16 through 20 are diagrams of an exemplary embodiment of a method of manufacturing a composite structure including a plurality of graphene sheets and a plurality of nanostructures.

Referring to FIG. 16, first, a substrate 730 is prepared. For example, a silicon substrate, a germanium substrate, a glass substrate, or a plastic substrate may be used as the substrate 730, but the substrate is not limited thereto. In an embodiment, the substrate may comprise silicon, germanium, a glass, or a combination comprising at least one of the foregoing. Then, a surface treatment operation may be performed on the substrate 730. In the surface treatment operation, a seed layer (not shown) for growing the plurality of nanostructures 710 may be disposed (e.g., formed) on a top surface of the substrate 730. If the substrate 730 is a silicon substrate, after the surface treatment operation is performed on the substrate 730, a seed layer for forming silicon nanostructures may be disposed (e.g., formed) on the top surface of the substrate 730. If the substrate 730 is a germanium substrate, after the surface treatment operation is performed on the substrate 730, a seed layer for forming germanium nanostructures may be disposed (e.g., formed) on the top surface of the substrate 730. Also, even if the surface treatment operation is not performed on the substrate 730, the plurality of nanostructures 710 may be disposed (e.g., formed). For example, if the substrate 730 is a glass substrate or a plastic substrate, it is possible to grow ZnO nanostructures on the substrate 730 with or without surface treating the substrate.

Figure 17:
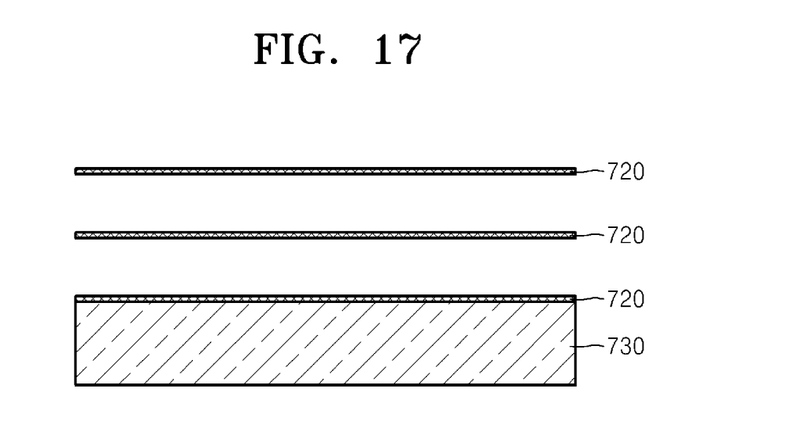

Referring to FIG. 17, each graphene sheet of the plurality of graphene sheets 720 is disposed at a regular interval on the substrate 730. The graphene sheet of the plurality of graphene sheets 720 that is disposed nearest the substrate (at the lowest position in FIG. 17) may be disposed to contact the substrate 730. The graphene sheets 720 that are disposed apart from the substrate 730 may be supported by a spacer (not shown). In addition, although the number of graphene sheets 720 that are disposed on the substrate 730 in FIG. 17 is three, the disclosed embodiments are not limited thereto. Thus, the number of the graphene sheets 720 on the substrate 730 may vary, and at least one graphene sheet of the plurality of graphene sheets 720 may be disposed on the substrate 730.

Figure 18:
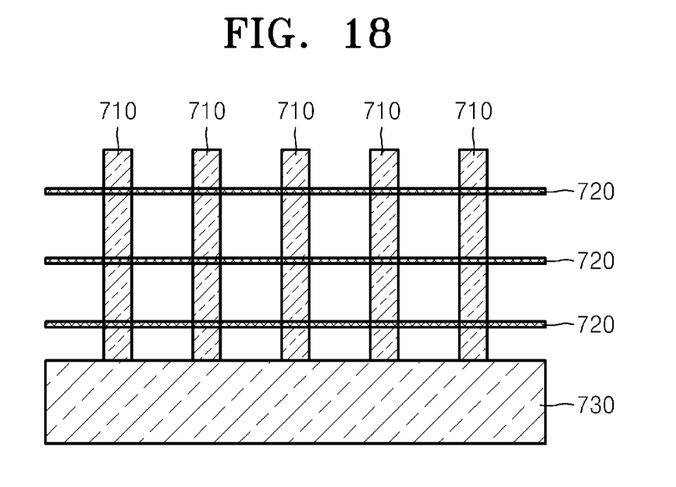

Referring to FIG. 18, each nanostructure of the plurality of nanostructures 710 may have a substantially one-dimensional shape and may be grown from the substrate 730. Each nanostructure of the plurality of nanostructures 710 may independently be a nanowire, a nanotube, or a nanorod. The plurality of nanostructures 710 may be grown via a dry process or a wet process. Each nanostructure of the plurality of nanostructures 710 may independently comprise a group IV semiconductor including C, Si, or Ge, a group III-V semiconductor, a group II-VI semiconductor, a group IV-IV semiconductor, a group IV-V-VI semiconductor, or a combination comprising at least one of the foregoing. In addition, the plurality of nanostructures 710 may comprise an oxide semiconductor including ZnO, a nitride semiconductor, a metal, or a combination comprising at least one of the foregoing, but the disclosed embodiments are not limited thereto. Thus, the plurality of nanostructures 710 may comprise various materials.

The plurality of nanostructures 710 may be grown through the graphene sheets 720 via the aforementioned growing process. Each nanostructure of the plurality of nanostructures 710 may be oriented (e.g., grown) through the graphene sheets 720 such that each nanostructure of the plurality of nanostructures 710 and each graphene sheet of the plurality of graphene sheets 720 has a common cross-section. Alternatively, each nanostructure of the plurality of nanostructures 710 may be oriented (e.g., grown) through the graphene sheets 720 such that none of the plurality of nanostructures 710 and the plurality of graphene sheets 720 have a common cross-section. In another embodiment, at least one nanostructure of the plurality of nanostructures 710 is oriented (e.g., grown) through the plurality of graphene sheets 720 such that at least one nanostructure of the plurality of nanostructures 710 and at least one graphene sheet of the plurality of graphene sheets 720 has a common cross-section and at least one nanostructure of the plurality of nanostructures 710 is oriented (e.g., grown) through the plurality of graphene sheets 720 such that at least one nanostructure of the plurality of nanostructures and at least one graphene sheet do not have a common cross-section. When the plurality of nanostructures 710 are grown through the plurality of graphene sheets 720, each graphene sheet may be moved by a regular distance in a growth direction of the plurality of nanostructures 710 relative to an adjacent graphene sheet.

Each nanostructure of the plurality of nanostructures 710 may independently be composed of a single material or may have a heterostructure in which different materials are combined with each other. For example, each nanostructure of the nanostructures 710 may independently have a heterostructure in a radial direction or a heterostructure in a longitudinal direction. Also, each nanostructure of the nanostructures 710 may be composed of the same material, or each nanostructure of the nanostructures 710 may be composed of a different material. In an embodiment, each of the plurality of nanostructures 710 may be doped with a material that alters the electrical properties of the nanostructure, for example a conductive material, or a donor or an acceptor, including a p-type material or an n-type material.

Figure 19:
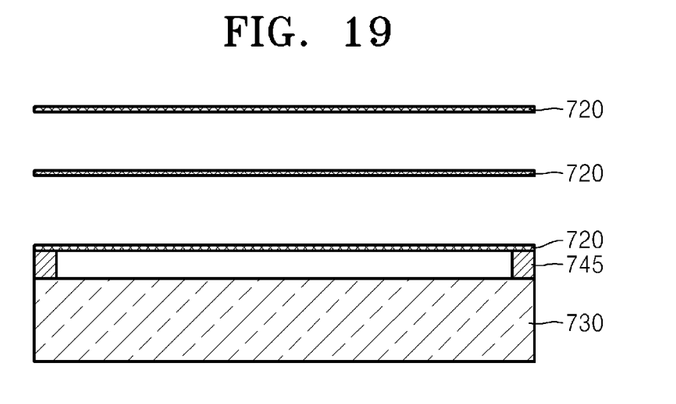
Figure 20:
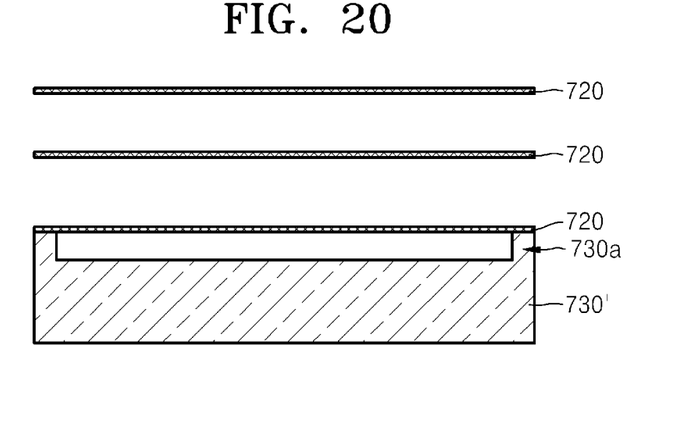

In an embodiment, as illustrated in FIG. 17, the graphene sheet of the plurality of graphene sheets 720 which is disposed nearest to the substrate 730 (at the lowest position in FIG. 17) from among the plurality of graphene sheets 720 may contact the substrate 730. In an embodiment, as illustrated in FIG. 19, graphene sheet nearest the substrate (at the lowest position in FIG. 19) may be separated from the substrate 730 by a spacer 745 disposed on the substrate 730 and having a selected height. By growing the plurality of nanostructures 710, each of which may be a nanowire, a nanorod, or a nanotube, from the substrate 730, as illustrated in FIG. 18, it is possible to obtain the plurality of nanostructures 710, each of which has a substantially one-dimensional shape and is oriented (e.g., grown) through the plurality of graphene sheets 720. In addition, as illustrated in FIG. 20, the graphene sheet nearest the substrate (the lowest positioned graphene sheet in FIG. 20) may be separated from the substrate 730 by a protrusion 730a that is disposed (e.g., formed) on an end of a substrate 730'. The protrusion 730a may be disposed (e.g., formed) on the substrate 730' via an etching process.

In an embodiment, the graphene sheets are disposed at a regular interval on the substrate 730, wherein the substrate may have undergone a surface treatment operation. However, as illustrated in FIG. 14, the graphene sheets may be disposed to contact each other on the substrate 730, wherein the substrate may have undergone the surface treatment operation. In an embodiment, when the plurality of nanostructures 710 are grown through the plurality of graphene sheets 720, during the growing each graphene sheet of the plurality of graphene sheets 720 may be moved by the regular distance relative to an adjacent graphene sheet in the growth direction of the plurality of nanostructures 710. Accordingly, as illustrated in FIG. 15, the plurality of graphene sheets 720 that are penetrated by the plurality of nanostructures 710 may be disposed at a regular interval and may be separated from a top surface of the substrate 730. The methods of manufacturing a composite structure according to the disclosed embodiments, the number of graphene sheets, and nanostructures may vary.

As described above, according to the above embodiments, it is possible to form a composite structure having a three-dimensional shape in which a nanostructure having a substantially one-dimensional shape is oriented (e.g., grown) through a graphene sheet, which has a substantially two-dimensional shape and high electrical conductivity. Such a composite structure may be used to manufacture a logic device, a memory device, a flexible and stretchable device, or the like.

It should be understood that the exemplary embodiments described herein should be considered in a descriptive sense only and not for purposes of limitation. Descriptions of features or aspects within each embodiment should be considered as available for other similar features or aspects in other embodiments.

What is claimed is:

1. A composite structure comprising:
    a graphene sheet having a first side and an opposite second side; and
    a nanostructure oriented through the graphene sheet and having a substantially one-dimensional shape, wherein the nanostructure comprises CdS, CdSe, CdTe, HgS, HgSe, HgTe, or a combination comprising at least one of the foregoing,
    wherein an axis of the nanostructure on the first side of the graphene sheet is substantially aligned with an axis of the nanostructure on the second side of the graphene sheet, and
    wherein the nanostructure and the graphene sheet have a common cross-section.

2. The composite structure of claim 1, wherein the nanostructure is a nanowire, a nanotube, or a nanorod.

3. The composite structure of claim 1, further comprising a plurality of the graphene sheets disposed at a regular interval, wherein the nanostructure is oriented through the plurality of graphene sheets.

4. The composite structure of claim 1, wherein the nanostructure further comprises a heterostructure in a radial direction or a heterostructure in a longitudinal direction.

5. The composite structure of claim 4, wherein the nanostructure is doped with a material that alters an electrical property of the nanostructure.

* * * * *